(12) United States Patent
Kobayashi et al.

(10) Patent No.: US 6,379,862 B1
(45) Date of Patent: Apr. 30, 2002

(54) RADIATION-SENSITIVE RESIN COMPOSITION

(75) Inventors: Satoshi Kobayashi, Shizuoka; Haruhiko Itoh, Hachiohji, both of (JP)

(73) Assignee: Clariant Finance (BVI) Limited, Tortola (VG)

( * ) Notice: Subject to any disclaimer, the term of this patent is extended or adjusted under 35 U.S.C. 154(b) by 0 days.

(21) Appl. No.: 09/582,010

(22) PCT Filed: Oct. 19, 1999

(86) PCT No.: PCT/JP99/05750

§ 371 Date: Jun. 20, 2000

§ 102(e) Date: Jun. 20, 2000

(87) PCT Pub. No.: WO00/23850

PCT Pub. Date: Apr. 27, 2000

(30) Foreign Application Priority Data

Oct. 20, 1998 (JP) ............................. 10-298710

(51) Int. Cl.[7] .............................. G03F 7/004; G03F 7/30
(52) U.S. Cl. ................ 430/270.1; 430/170; 430/192; 430/325; 430/330
(58) Field of Search .............................. 430/270.1, 192, 430/325, 330, 170

(56) References Cited

U.S. PATENT DOCUMENTS 5,340,697 A * 8/1994 Yoshimoto et al. ...... 430/270.1
5,529,885 A    6/1996 Ochiai et al.

FOREIGN PATENT DOCUMENTS

JP           2-37348      *  7/1988

OTHER PUBLICATIONS

International Search Report PCT/JP99/05750.
Abstract of JP 60,111,240.
Abstract of JP 61,023,618.
Abstract of JP 5,178,951.
Abstract of JP 7,092,668.
Abstract of JP 2,037,348.

* cited by examiner

*Primary Examiner*—John S. Chu
(74) *Attorney, Agent, or Firm*—Sangya Jain

(57) ABSTRACT

A good heat-resistant radiation-sensitive resin composition containing an alkali-soluble resin obtained by condensation, with phenols as necessary, of methylolated bisphenols represented by following general formula, a cross-linking agent and a photosensitizer.

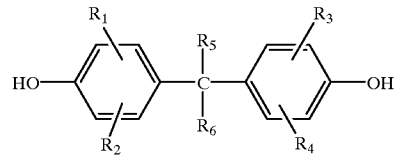

wherein $R_1$ to $R_4$ each represents a hydrogen atom, an alkyl group having 1 to 3 carbon atoms, or —$CH_2OH$, whereupon at least one of $R_1$ to $R_4$ represents —$CH_2OH$, and $R_5$ and $R_6$ each represents a hydrogen atom or an alkyl group having 1 to 3 carbon atoms.

5 Claims, No Drawings

RADIATION-SENSITIVE RESIN COMPOSITION

TECHNICAL FIELD

This invention relates to a novel radiation-sensitive resin composition and, more particularly, to a radiation-sensitive resin composition suited for manufacture of semiconductors or preparation of a display surface of liquid crystal display (LCD) panel, which can realize high sensitivity, high resolution and high heat resistance.

BACKGROUND ART

In the field of manufacturing semiconductor elements such as very LSI or preparing a display surface of liquid crystal display (LCD) panel, various positive-working or negative-working radiation-sensitive resin compositions have conventionally been used as resist materials for photolithography. As the mother glass for preparation of LCD panels is becoming large-sized in recent years, there is increasing demand for high accuracy of displays. Liquid crystal panels using amorphous silicon have so far been mainly employed. In view of high accuracy of displays or the like, however, liquid crystal panels using low-temperature polysilicon have come to be noticed. Conventional liquid crystal panels using low-temperature polysilicon have mostly been of small size, but it is required to apply low-temperature polysilicon to large-sized liquid crystal panels.

However, with introduction of low-temperature polysilicon for manufacturing large-sized liquid crystal panels, there occurs the problem of high loading onto the resist upon ion injection, that is, a significant increase in temperature of the substrate. It is said that temperature of the surface of the resist rises to 300° C. or more upon ion injection, but resist patterns formed by using conventional radiation-sensitive resin compositions do not have resistance to this temperature, so the conditions for ion injection must be weakened under the present circumstances.

On the other hand, ion injection has also been conducted in manufacturing semiconductors. In the process of manufacturing semiconductors, patterned photoresists are further subjected to cross-linking with UV rays (UV curing) or to thermal treatment for a long time to harden the photoresists themselves for improving heat resistance before ion injection. Therefore, it is possible in the process of manufacturing semiconductors to reduce the influence of loading upon resists. However, in the process of manufacturing liquid crystal panels, such UV ray cross-linking or long-time thermal treatment is considered to be difficult to conduct in view of increased size of mother glass or improvement of throughput (processing amount per unit time).

Under such circumstances, there is an increasing demand for a photoresist which itself has an enough excellent heat resistance to undergo almost no deformation of pattern upon being heated. Use of such highly heat resistant photoresist will enable one to employ stronger ion-injecting conditions upon manufacturing liquid crystal panels without conducting UV ray cross-linking or long-time thermal treatment. Additionally, stronger ion-injecting conditions enables one to manufacture TFT (thin film transistor) elements with higher performance, and ion injection with higher energy will shorten tact time.

Specifically, in the conventional process of manufacturing liquid crystal panels, photoresist materials of cyclized polyisoprene type or novolak type have popularly been used. However, these photoresist materials can stand at most about 150° C. and cannot be subjected to the process which requires higher heat resistance.

Thus, it has recently been attempted to impart radiation sensitivity to cyclic olefin resins. For example, there have been proposed a radiation-sensitive composition prepared by compounding an aromatic bisazide compound in a polymer obtained by ring-opening polymerization of norbornene derivative (Japanese Unexamined Patent Publication No. S60-111240) and a radiation-sensitive polymer composition containing a photo-polymerization initiator, a sensitizer, a copolymerizable monomer and an adhesion-improving agent (Japanese Unexamined Patent Publication No. S61-23618). Further, there have also been proposed a novolak thermosetting resin (Japanese Unexamined Patent Publication No. H5-178951), a composition containing a cyclic olefin resin and an aromatic bisazide compound (Japanese Unexamined Patent Publication No. H7-92668), and the like. These radiation-sensitive resin compositions have heat resistance improved to some extent, but their heat resistance is still insufficient, thus further improvement in heat resistance being desired.

As has been described above, conventional photoresists suffer pattern sagging or change in pattern line width due to their insufficient heat resistance when patterned photoresists are heated to a temperature of 200° C. or more. It is an object of the present invention to provide a radiation-sensitive resin composition which does not have the defects with conventional radiation-sensitive compositions, that is, which shows high heat resistance, high sensitivity and high resolution and which can form a pattern with a good profile with only a small process dependence of dimensional accuracy.

DISCLOSURE OF THE INVENTION

As a result of intensive investigations, the inventors have found that a chemically amplified radiation-sensitive resin composition containing an alkali-soluble resin, a cross-linking agent and an acid generating agent wherein said alkali-soluble resin is a particular resin can form a resist image with high sensitivity, high resolution, good resist pattern form and extremely high heat resistance, thus having achieved the present invention based on the finding.

That is, the present invention is a radiation-sensitive resin composition containing an alkali-soluble resin, a cross-linking agent and an acid generating agent, wherein said alkali-soluble resin is an alkali-soluble resin obtained by condensation, with phenols as necessary, of methylolated bisphenols represented by the general formula (I):

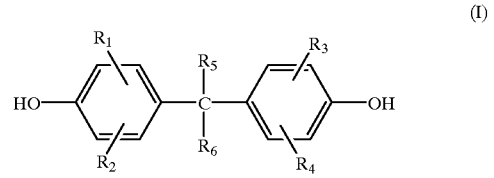

wherein $R_1$ to $R_4$ each represents a hydrogen atom, an alkyl group having 1 to 3 carbon atoms, or —$CH_2OH$, whereupon at least one of $R_1$ to $R_4$ represents —$CH_2OH$, and $R_5$ and $R_6$ each represents a hydrogen atom or an alkyl group having 1 to 3 carbon atoms.

The present invention will be described in more detail below. Firstly, the methylolated bisphenols represented by the foregoing general formula (I) can be obtained by reacting bisphenols with formalin in the presence of a basic catalyst, followed by acid precipitation. As the bisphenols, there are illustrated, for example, bisphenol A, B, C, E, F or G. Of these, bisphenol A, bisphenol B and bisphenol F are preferred. As the methylolated compound, any of mono-, di-, tri- and tetra-methylolated compounds may be used, with tetramethylolated compounds represented by, for example, the following formula (II) being preferred.

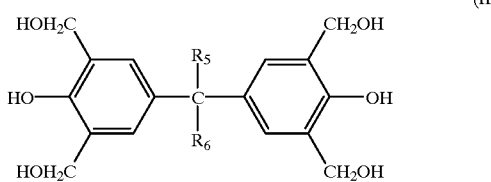

Secondly, the alkali-soluble resin of the present invention is obtained by condensation, with a phenol or a mixture of phenols as necessary, of methylolated bisphenols represented by the foregoing general formula (I) with an aldehyde such as formalin being optionally added thereto. The phenols used here include so-called phenols, bisphenols, naphthols, etc. and are specifically exemplified by phenol, p-cresol, m-cresol, o-cresol, 2,3-dimethylphenol, 2,4-dimethylphenol, 2,5-dimethylphenol, 2,6-dimethylphenol, 3,4-dimethylphenol, 3,5-dimethylphenol, 2,3,4-trimethylphenol, 2,3,5-trimethylphenol, 3,4,5-trimethylphenol, 2,4,5-trimethylphenol, methylenebisphenol, methylenebis-p-cresol, resorcinol, catechol, 2-methylresorcinol, 4-methylresorcinol, o-chlorophenol, m-chlorophenol, p-chlorophenol, 2,3-dichlorophenol, m-methoxyphenol, p-methoxyphenol, p-butoxyphenol, o-ethylphenol, m-ethylphenol, p-ethylphenol, 2,3-diethylphenol, 2,5-diethylphenol, p-isopropylphenol, α-naphthol, β-naphthol, etc.

Examples of the optionally used aldehydes include formalin, paraformaldehyde, acetaldehyde, benzaldehyde, hydroxybenzaldehyde and chloroacetaldehyde, which may be used independently or as a mixture of two or more of them.

Proportion of the methylolated bisphenols to one or more of the various phenols (by weight) is 40:60 to 100:0, preferably 50:50 to 90:10. If necessary, the alkali-soluble resins may be used together with other alkali-soluble resins. As such other alkali-soluble resins, there are illustrated, for example, copolymers of vinylphenol or isopropenylphenol with styrene, acrylonitrile, methyl methacrylate or methyl acrylate. The alkali-soluble resins have a weight average molecular weight, in terms of polystyrene, of 2,000 to 10,000, preferably 3,000 to 7,000.

As the cross-linking agent to be used in the present invention, there may preferably be illustrated alkoxyalkylated melamine resins, alkoxyalkylated benzoguanamine resins, alkoxyalkylated urea resins, etc. as well as melamine type, guanamine type and urea type low molecular derivatives. Specific examples of such alkoxyalkylated amino resins include methoxymethylated melamine resin, ethoxymethylated melamine resin, propoxymethylated melamine resin, butoxymethylated melamine resin, ethoxymethylated benzoguanamine resin, methoxymethylated urea resin, ethoxymethylated urea resin, propoxymethylated urea resin, butoxymethylated urea resin, etc. Melamine type, guanamine type and urea type low molecular derivatives include methoxymethylated melamine, ethoxymethylated melamine, propoxymethylated melamine, butoxymethylated melamine, hexamethylolmelamine, acetoguanamine, benzoguanamine, methylated benzoguanamine, monomethylolurea and dimethylolurea. Of these, melamine type or guanamine type low molecular derivatives, alkoxyalkylated benzoguanamine resin and alkoxyalkylated melamine resins are particularly preferred.

These cross-linking agents may be used independently or in combination of two or more, and are compounded in an amount of usually 2 to 50 parts by weight, preferably 5 to 30 parts by weight, per 100 parts by weight of the alkali-soluble resin.

As the acid generating agent to be used in the present invention, any of those compounds that have conventionally been used as acid generating agents in a chemically amplified radiation-sensitive composition may be used. Examples thereof include onium salts, halogen-containing compounds, diazoketone compounds, sulfone compounds, sulfonic acid compounds, etc. As the onium salts, there are illustrated iodonium salts, sulfonium salts, diazonium salts, ammonium salts, pyridinium salts, etc. As the halogen-containing compounds, there are illustrated haloalkyl group-containing hydrocarbon compounds, haloalkyl group-containing heterocyclic compounds, etc. As the diazoketone compounds, there are illustrated 1,3-diketo-2-diazo compounds, diazobenzoquinone compounds, diazonaphthoquinone compounds, etc. As the sulfone compounds, there are illustrated β-ketosulfones, β-sulfonylsulfones, etc. and, as the sulfonic acid compounds, there are illustrated alkylsulfonic acid esters, haloalkylsulfonic acid esters, arylsulfonic acid esters, iminosulfonates, etc. Of these, haloalkyl group-containing heterocyclic compounds such as 2,4,6-tris (trichloromethyl)triazine are preferred.

These acid generating agents may be used alone or in combination of two or more in an amount of usually 0.1 to 10 parts by weight, preferably 0.5 to 5.0 parts by weight, per 100 parts by weight of the alkali-soluble resin.

In addition, basic compounds may preferably be incorporated as additives in the radiation-sensitive resin composition of the present invention. The basic compounds can function to control diffusion in the resist coat of an acid produced from the acid generating agent upon exposure and improve resolution and exposure latitude. As such basic compounds, any of those basic compounds that have conventionally been used in a chemically amplified radiation-sensitive composition may be used. Examples thereof include, primary, secondary or tertiary aliphatic amines, aromatic amines, heterocyclic amines, nitrogen-containing compounds which contain an alkyl group, an aryl group or the like, amido group- or imido group-containing compounds, aliphatic amonium compounds, etc.

As solvents for dissolving the alkali-soluble novolak resin of the present invention and the photosensitizer, there may be illustrated ethylene glycol monoalkyl ethers such as ethylene glycol monomethyl ether, ethylene glycol monoethyl ether, etc.; ethylene glycol monoalkyl ether acetates such as ethylene glycol monomethyl ether acetate, ethylene glycol monoethyl ether acetate, etc.; propylene glycol monoalkyl ethers such as propylene glycol monomethyl ether, propylene glycol monoethyl ether, etc.; propylene glycol monoalkyl ether acetates such as propylene glycol monomethyl ether acetate, propylene glycol monoethyl ether acetate, etc.; lactic esters such as methyl lactate, ethyl lactate, etc.; aromatic hydrocarbons such as toluene, xylene, etc.; ketones such as methyl ethyl ketone, 2-heptanone, cyclohexanone, etc.; amides such as N,N-dimethylacetamide, N-methylpyrrolidone, etc.; lactones such as γ-butyrolactone, etc.; and the like. These solvents are used independently or in combination of two or more of them.

The radiation-sensitive resin composition of the present invention may further contain, if necessary, a dye, an adhesion aid, a surfactant, etc. Examples of the dye include Methyl Violet, Crystal Violet, Malachite Green, etc., examples of the adhesion aid include hexamethyldisilazane, chloromethylsilane, etc., and examples of the surfactant include nonionic surfactants such as polyglycols and the derivatives thereof, i.e., polypropylene glycol or polyoxyethylene lauryl ether, fluorine-containing surfactants such as Fluorad (trade name; made by Sumitomo 3M), Megafac (trade name; made by Dainippon Ink and Chemicals Inco.), Sulfulon (trade name; made by Asahi Glass Co., Ltd.), and organosiloxane surfactants such as KP341 (trade name; made by Shin-etu Kagaku Kogyo K. K.)

BEST MODE FOR PRACTICING THE INVENTION

The present invention will now be described more specifically by reference to Examples which, however, are not to be construed to limit the present invention in any way.

SYNTHESIS EXAMPLE 114 g of bisphenol A, 163 g of 37 wt % formalin and 170 g of water were charged into a separable flask, and a mixed solution composed of 40 g of sodium hydroxide and 40 g of water were dropwise added thereto using a dropping funnel. After completion of the dropwise addition, temperature of the reaction mixture was raised to 45° C., and the reaction was conducted for 8 hours under stirring. After completion of the reaction, the reaction solution was cooled to 15° C., and 500 ml of 2 N hydrochloric acid was dropwise added thereto using a dropping funnel to conduct acid precipitation. Thus, there was precipitated powdery crystals of bis (3,5-dihydroxymethyl-4-hydroxyphenyl) dimethylmethane. The crystals were filtered out, washed with water, and dried to obtain 140 g of powdery crystals. Purity of the product measured by liquid chromatography was 99.0 wt %.

A mixture of the tetramethylolated bisphenol A obtained above and m-cresol (60:40 by weight) and 2 parts by weight of oxalic acid per 100 parts by weight of the mixture were charged and reacted for 5 hours at a reaction temperature of 100° C. The thus obtained alkali-soluble resin A has a molecular weight, as determined using polystyrene standards, of 6,200.

EXAMPLE

| | |
|---|---|
| Alkali-soluble resin A obtained in Synthesis Example | 100 parts by weight |
| Ethoxymethylated benzoguanamine resin | 25 parts by weight |
| 2,4,6-Tris(trichloromethyl)-triazine | 3 parts by weight |
| Tetrabutylammonium hydroxide | 0.5 part by weight |

The above-described ingredients were dissolved in propylene glycol monomethyl ether acetate, filtered through a Teflon-made 0.2 μm membrane filter to prepare a negative-working radiation-sensitive composition. This composition was spin-coated on a 4-inch silicon wafer, baked at 100° C. for 90 seconds on a hot plate to obtain a 1.5 μm-thick resist coating. This resist coating was exposed using a g-line stepper made by GCA Co. (DSW6400, NA=0.42), then subjected to PEB (post exposure baking) at 130° C. for 90 seconds, followed by developing in a 2.38 wt % tetramethylammonium hydroxide aqueous solution for 60 seconds to form a pattern.

The thus formed patterns were heat-treated for 3 minutes at temperatures of 100° C., 150° C., 180° C., 200° C. and 300° C., respectively, and form and bottom line width of a 3 μm-line pattern were observed under a scanning electron microscope (SEM). Results thus obtained are tabulated in Table 1. The negative-working radiation-sensitive composition of the present invention showed no large change in the form of line pattern even after being heat-treated at 300° C.

COMPARATIVE EXAMPLE

The same procedures as in Example were conducted except for changing the alkali-soluble resin to novolak resin obtained by charging a cresol mixture of m-cresol/p-cresol (6/4 in ratio) and 56 parts by weight of 37 wt % formaldehyde and 2 parts by weight of oxalic acid per 100 parts by weight of the cresol mixture and conducting the reaction at a reaction temperature of 100° C. for 5 hours, thus a negative-working radiation-sensitive composition being prepared. Line patterns were formed in the same manner as in Example.

The thus formed patterns were heat-treated for 3 minutes at temperatures of 100° C., 150° C., 180° C. and 200° C., respectively, and form and bottom line width of a 3 μm-line pattern were observed under a scanning electron microscope (SEM) in the same manner as in Example. Results thus obtained are tabulated in Table 1. The negative-working radiation-sensitive composition of the Comparative Example underwent change in the form of line pattern starting at about 150° C. and, at 200° C., line patterns formed were connected to each other, thus observation of line width becoming impossible.

TABLE 1

| | Temperature (° C.) | | | | |
|---|---|---|---|---|---|
| | 100 | 150 | 180 | 200 | 300 |
| Example | 3.0 μm | 3.0 μm | 3.0 μm | 3.0 μm | 3.1 μm |
| Comparative Example | 3.0 μm | 3.4 μm Line patterns show roundish shape | 4.6 μm Line patterns show conspicuous sagging | Line patterns are connected to each other | — |

ADVANTAGES OF THE INVENTION

In the processes for manufacturing semiconductor elements or display surface of LCD panels, in which finer patterning is considered to proceed in the near future, conventional photoresists have the problem that a patterned photoresist suffers sagging or change in pattern line width due to their insufficient heat resistance. The radiation-sensitive resin composition of the present invention enables one to form a resist pattern with high resolution, good form and excellent heat resistance. The present invention provides a radiation-sensitive resin composition showing dimensional accuracy with less process dependence, i.e., having a large process latitude.

Industrial Utility

As has been described hereinbefore, the radiation-sensitive resin composition of the present invention is useful as a fine resist pattern-forming material for manufacturing integrated circuits or display surface of LCD panel.

What is claimed is:

1. A negative working radiation-sensitive resin composition comprising an alkali-soluble resin, an acid generating agent and a cross-linking agent, said radiation-sensitive resin composition is characterized in that said alkali-soluble resin is obtained by condensation, with phenols as necessary, of methylolated bisphenols represented by the general formula (I):

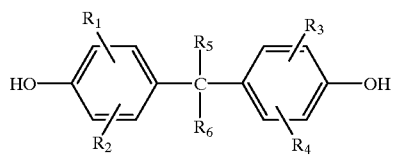

wherein $R_1$ to $R_4$ represents —$CH_2OH$, and $R_5$ and $R_6$ each represents a hydrogen atom or an alkyl group having 1 to 3 carbon atoms.

2. The composition according to claim 1 wherein the ratio by weight of the methylolated bisphenols represented by the general formula (I) and the phenols ranges from 40:60 to 100:0.

3. The composition according to claim 1, where the phenols are a single phenol or mixture of phenols selected from phenol, bisphenol, naphthol and their derivatives.

4. The composition according to claim 3, where the phenols are a single phenol or mixture of phenols selected from p-cresol, m-cresol, o-cresol, 2,3-dimethylphenol, 2,4-dimethylphenol, 2,5-dimethylphenol, 2,6-dimethylphenol, 3,4-dimethylphenol, 3,5-dimethylphenol, 2,3,4,-trimethyphenol, 2,3,5,-trimethyphenol, 3,4,5-trimethyphenol, 2,4,5-trimethyphenol, methylenebisphenol, methylenebis-p-cresol, resorcinol, catechol, 2-methylresorcinol, 4-methylresorcinol, o-chlorophenol, m-chlorophenol, p-chlorophenol, 2,3-dichlorophenol, m-methoxyphenol, p-methoxyphenol, p-butoxyphenol, o-ethylphenol, m-ethylphenol, p-ethylphenol, 2,3-diethylphenol, 2,5-diethylphenol, p-isopropylphenol, alpha-naphthol, and beta-naphthol.

5. A process for forming a negative image on a substrate comprising the steps of:

a) coating a substrate with the radiation sensitive resin composition of claim 1;

b) imagewise exposing the coating;

c) baking the coating and thereby crosslinking the coating; and, d) developing the baked coating with an alkaline developer to give a negative image.

* * * * *